(12) United States Patent
Kim et al.

(10) Patent No.: US 10,327,347 B2
(45) Date of Patent: Jun. 18, 2019

(54) DOUBLE HINGE MODULE AND MOBILE TERMINAL

(71) Applicant: LG ELECTRONICS INC., Seoul (KR)

(72) Inventors: Seyong Kim, Seoul (KR); Minchul Lee, Seoul (KR); Hyunseok Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/862,948

(22) Filed: Jan. 5, 2018

(65) Prior Publication Data

US 2019/0132975 A1 May 2, 2019

(30) Foreign Application Priority Data

Oct. 31, 2017 (KR) .................. 10-2017-0143302

(51) Int. Cl.
*G06F 1/16* (2006.01)
*H05K 5/02* (2006.01)
*E05D 3/12* (2006.01)
*H05K 5/00* (2006.01)
*E05D 11/08* (2006.01)

(52) U.S. Cl.
CPC ............ *H05K 5/0226* (2013.01); *E05D 3/12* (2013.01); *E05D 11/082* (2013.01); *G06F 1/1652* (2013.01); *G06F 1/1681* (2013.01); *H05K 5/0017* (2013.01); *E05D 2011/085* (2013.01); *E05Y 2900/606* (2013.01)

(58) Field of Classification Search
CPC .......................... G06F 1/1652; G06F 1/1681
See application file for complete search history.

(56) References Cited

U.S. PATENT DOCUMENTS

| 6,377,324 | B1 * | 4/2002 | Katsura | G02F 1/133305 |
| | | | | 349/58 |
| 6,577,496 | B1 * | 6/2003 | Gioscia | G06F 1/1616 |
| | | | | 345/156 |
| 8,804,324 | B2 * | 8/2014 | Bohn | G06F 1/1616 |
| | | | | 345/1.1 |
| 9,348,369 | B2 * | 5/2016 | Kee | G06F 1/1616 |

(Continued)

FOREIGN PATENT DOCUMENTS

WO WO 2010/128715 A1 11/2010

*Primary Examiner* — Adrian S Wilson
(74) *Attorney, Agent, or Firm* — Birch, Stewart, Kolasch & Birch, LLP

(57) ABSTRACT

There is disclosed a double hinge module comprising a first rotary cam which is rotatable on a first shaft; a first coupling slot extended from one end of the first rotary cam in a direction which gets farther from the first shaft; a second rotary cam which is rotatable on the second shaft parallel with the first shaft in the reverse direction of the first rotary cam; a second coupling slot extended from one end of the second rotary cam which gets farther from the second shaft; and a link having one end coupled to the first coupling slot and the other end coupled to the second coupling slot, wherein when the first rotary cam and the second rotary cam are rotating, the link is linearly movable in parallel with a central line connecting the first shaft and the second shaft with each other, so that the double hinge module may fold the mobile terminal from 0° to 180° naturally like a book.

19 Claims, 10 Drawing Sheets

(56) References Cited

U.S. PATENT DOCUMENTS

| | | | |
|---|---|---|---|
| 9,348,450 B1 | 5/2016 | Kim | |
| 2004/0212956 A1 | 10/2004 | Kuivas et al. | |
| 2006/0050169 A1* | 3/2006 | Misawa | G06F 1/1616 348/333.06 |
| 2006/0146488 A1* | 7/2006 | Kimmel | G06F 1/1616 361/679.04 |
| 2008/0079656 A1* | 4/2008 | Kee | G06F 1/1616 345/1.3 |
| 2009/0000062 A1 | 1/2009 | Yamanami | |
| 2012/0236484 A1* | 9/2012 | Miyake | G06F 1/1616 361/679.01 |
| 2013/0010405 A1* | 1/2013 | Rothkopf | H04M 1/0216 361/679.01 |
| 2014/0111954 A1 | 4/2014 | Lee et al. | |
| 2014/0152576 A1* | 6/2014 | Kim | G06F 3/03545 345/169 |
| 2015/0040353 A1 | 2/2015 | Chen et al. | |
| 2015/0153787 A1 | 6/2015 | Mok et al. | |
| 2015/0241925 A1* | 8/2015 | Seo | G06F 1/1652 361/679.27 |
| 2015/0378397 A1* | 12/2015 | Park | G06F 1/1652 361/679.27 |

* cited by examiner

FIG. 3
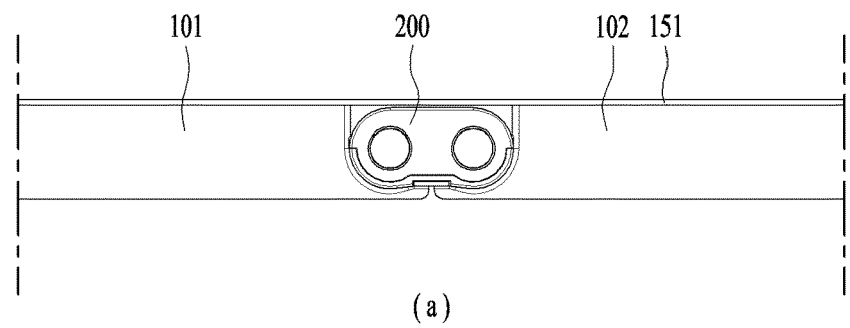
(a)
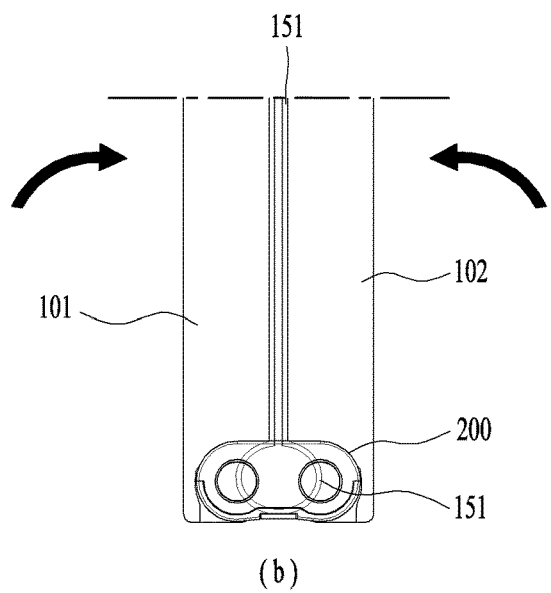
(b)

FIG. 10
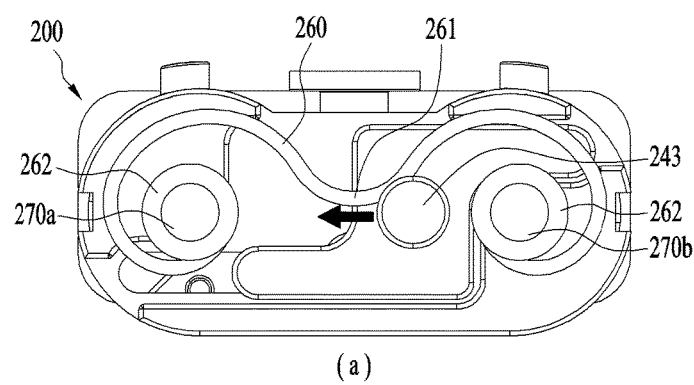
(a)
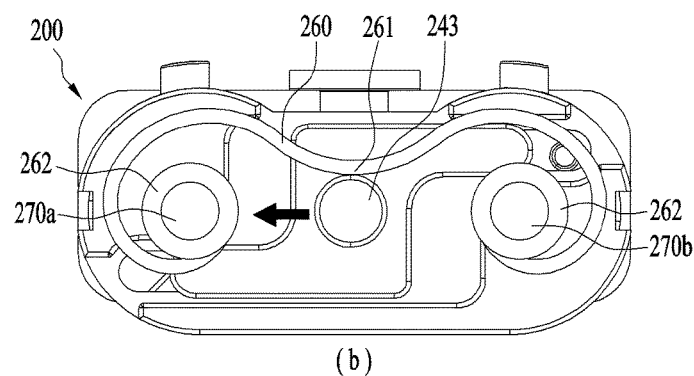
(b)
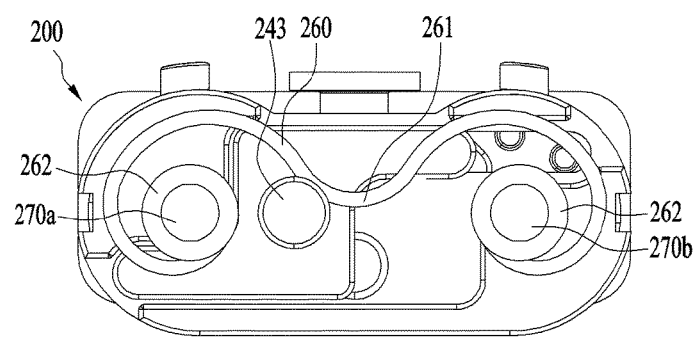
(c)

DOUBLE HINGE MODULE AND MOBILE TERMINAL

CROSS-REFERENCE TO RELATED APPLICATIONS

This application claims priority to Korean Patent Application No. 10-2017-0143302, filed on Oct. 31, 2017 in Korea, the entire contents of which is hereby incorporated by reference in its entirety.

BACKGROUND OF THE DISCLOSURE

Field of the Disclosure

Embodiments of the present disclosure relate to a double hinge module which may fold a pair of bodies like a book and have a hinge not projected outside and a mobile terminal including the same.

Background of the Disclosure

Terminals may be generally classified as mobile/portable terminals or stationary terminals according to their mobility. Especially, as the mobile terminals using liquid crystal or organic light emitting diodes are developed, the size of the mobile terminals become smaller and the functions of the mobile terminals become more diversified.

Moreover, as a touch function is provided to the mobile terminal, diverse functions can be realized in the mobile terminal even without any physical keypad. As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

The larger screen is provided, the more information the mobile terminal is capable of providing so that the mobile terminal having the large screen is preferred. However, the size of the screen is restricted in an aspect of portability. There are continuous studies and researches on techniques configured to enhance the portability by reducing the volume through a method for an overlapping method using a two hinge type or a slide type.

SUMMARY OF THE DISCLOSURE

Accordingly, an object of the present invention is to address the above-noted and other problems.

Embodiments of the present disclosure may provide a double hinge module comprising: a first rotary cam which is rotatable on a first shaft; a first coupling slot extended from one end of the first rotary cam in a direction which gets farther from the first shaft; a second rotary cam which is rotatable on the second shaft parallel with the first shaft in the reverse direction of the first rotary cam; a second coupling slot extended from one end of the second rotary cam which gets farther from the second shaft; and a link having one end coupled to the first coupling slot and the other end coupled to the second coupling slot, wherein when the first rotary cam and the second rotary cam are rotating, the link is linearly movable in parallel with a central line connecting the first shaft and the second shaft with each other.

The first coupling slot may be located in a predetermined portion of the central line and the second coupling slot is located in the other opposite portion of the central line.

The double hinge module may further comprise a middle frame disposed between the link and the first and second rotary cams and having the first and second shafts coupled thereto; a first penetrating slot and a second penetrating slot which are formed the middle frame, in parallel with the central line; and a first coupling projection projected from one end of the link and coupled to the second coupling slot via the second penetrating slot, wherein when the first and second rotary cams are rotating, the first coupling projection and the second coupling projection are moving along the first penetrating slot and the second penetrating slot.

The double hinge module may further comprise a hinge housing defining an exterior design of the double hinge module and having the middle frame coupled thereto.

The double hinge module may further comprise a stopping projection projected from the link; and an elastic stopper projected on a linear movement passage of the stopping projection, wherein the first rotary cam and the second rotary cam rotate when a preset force or more is applied thereto.

The elastic stopper may be a plate spring coupled to at least one of the first and second shafts.

The double hinge module may further comprise a guide plate comprising a guide slot extended in parallel with the central line, wherein the stopping projection is inserted in the guide slot and movable in a direction in which the guide slot is extended.

A radius of each of the first and second coupling projections may be 'r', and a distance from ends of the first and second coupling slots and the first and second shafts may be 'a-r', and a radius of each of the first and second rotary cams is larger than a√2.

The maximum rotation angle of the first and second rotary may be 90°, and the link may be linearly moved as far as 2a.

Embodiments of the present disclosure may also provide a mobile terminal comprising: a first body; a second body; a display unit arranged in one surface of the first body and one surface of the second body and comprising a flexible material; a double hinge module coupled between the first body and the second body and configured to vary angles of the first body and the second body; and a connect portion provided in neighboring ends of the first body and the second body which are covered with the display unit and concavely formed in one surface of the first body and one surface of the second body, wherein the display unit forms a flat surface in a state where the first body and the second body are unfolded with lateral surfaces facing each other, and a predetermined area of the display unit is accommodated by the connect portion in a state where the first body and the second body are folded with the surfaces facing each other.

Each of the first and second bodies may comprise a bezel area to which the display unit is not coupled, and the double hinge module may be provided in the bezel areas.

A pair of double hinge modules may be provided in both ends of the connect portion, respectively.

The mobile terminal may further comprise a bracket formed in a corresponding shape to the shape of the connect portion, wherein the bracket is exposed outside in the folded state.

The double hinge module may comprise a first rotary cam which is rotatable on a first shaft; a first coupling slot extended from one end of the first rotary cam in a direction which gets farther from the first shaft; a second rotary cam which is rotatable on the second shaft parallel with the first shaft in the reverse direction of the first rotary cam; a second coupling slot extended from one end of the second rotary cam which gets farther from the second shaft; and a link having one end coupled to the first coupling slot and the other end coupled to the second coupling slot, and when the first rotary cam and the second rotary cam are rotating, the link is linearly movable in parallel with a central line connecting the first shaft and the second shaft with each other.

When one lateral surface of the first body faces one lateral surface of the second body, the first body and the second body may be arranged in parallel with the central line. When one surface of the first body faces one surface of the second body, the first body and the second body may be vertically arranged with respect to the central line.

The mobile terminal may further comprise a middle frame disposed between the link and the first and second rotary cams and having the first and second shafts coupled thereto; a first penetrating slot and a second penetrating slot which are formed the middle frame, in parallel with the central line; and a first coupling projection projected from one end of the link and coupled to the second coupling slot via the second penetrating slot, wherein when the first and second rotary cams are rotating, the first coupling projection and the second coupling projection are moving along the first penetrating slot and the second penetrating slot.

The mobile terminal may further comprise a stopping projection projected from the link; and an elastic stopper projected on a linear movement passage of the stopping projection, wherein the first rotary cam and the second rotary cam rotate when a preset force or more is applied thereto.

The mobile terminal may further comprise a guide plate comprising a guide slot extended in parallel with the central line, wherein the stopping projection is inserted in the guide slot and movable in a direction in which the guide slot is extended.

A radius of each of the first and second coupling projections may be 'r', and a distance from ends of the first and second coupling slots and the first and second shafts is 'a-r', and a radius of each of the first and second rotary cams is larger than a√2.

The maximum rotation angle of the first and second rotary may be 90°, and the link may be linearly moved as far as 2a.

According to at least one of the embodiments, the mobile terminal may be foldable from 0° to 180° and it can be folded and unfolded naturally like a book.

Furthermore, the display unit may be located between the first body and the second body even in the unfolded state and it can provide a continuous screen to the user.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

FIG. 3 is a side view of the mobile terminal in accordance with one embodiment;

FIG. 10 is a diagram illustrating a stopping projection and an elastic stopper along movement of a link when the double hinge module is rotating.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

The terminology used in the present disclosure is used only to describe specific embodiments, not intended to limit the present disclosure. A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

In general, a suffix such as "module" and "unit" may be used to refer to elements or components. Use of such a suffix herein is merely intended to facilitate description of the specification, and the suffix itself is not intended to give any special meaning or function.

Hereinafter, a mobile terminal 100 in accordance with embodiments of the present disclosure will be described in detail, referring to the accompanying drawings. For the sake of brief description with reference to the drawings, the same or equivalent components may be provided with the same reference numbers, and description thereof will not be repeated.

Figure 1:
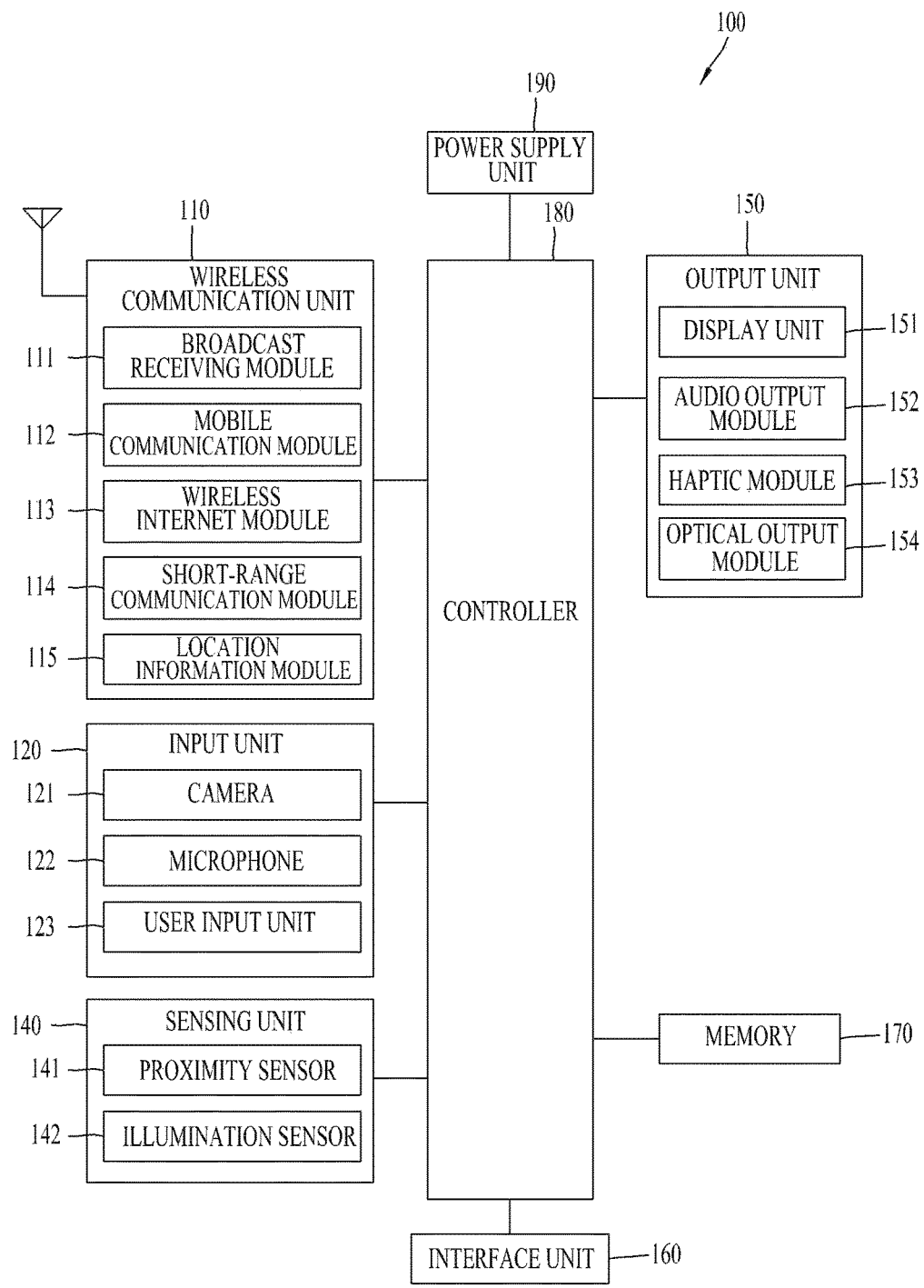
FIG. 1 is a block diagram of a mobile terminal in accordance with the present disclosure.

FIG. 1 is a block diagram to describe a mobile terminal associated with the present disclosure. The mobile terminal 100 is shown having components such as a wireless communication unit 110, an input unit 120, a sensing unit 140, an output unit 150, an interface unit 160, a memory 170, a controller 180, and a power supply unit 190.

It is understood that implementing all of the illustrated components in The FIG. 1A is not a requirement, and that greater or fewer components may alternatively be implemented.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller may be implemented to control a predetermined number of the components mentioned above in reference with FIG. 1A. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

As the display unit, a liquid crystal display (LCD) and a thin film transistor-liquid crystal display (TFT LCD) are typically used in a conventional mobile terminal. Recently, an ultra-thin display with no backlights such as an organic light-emitting diode (OLED) is used and such OLED made of a flexible material is capable of realizing a flexible display.

When using such a flexible display, the shape of the mobile terminal may be deformable in the area where the display unit 151 is arranged and a bar-shaped mobile terminal may be diversified in various shapes.

Figure 2:
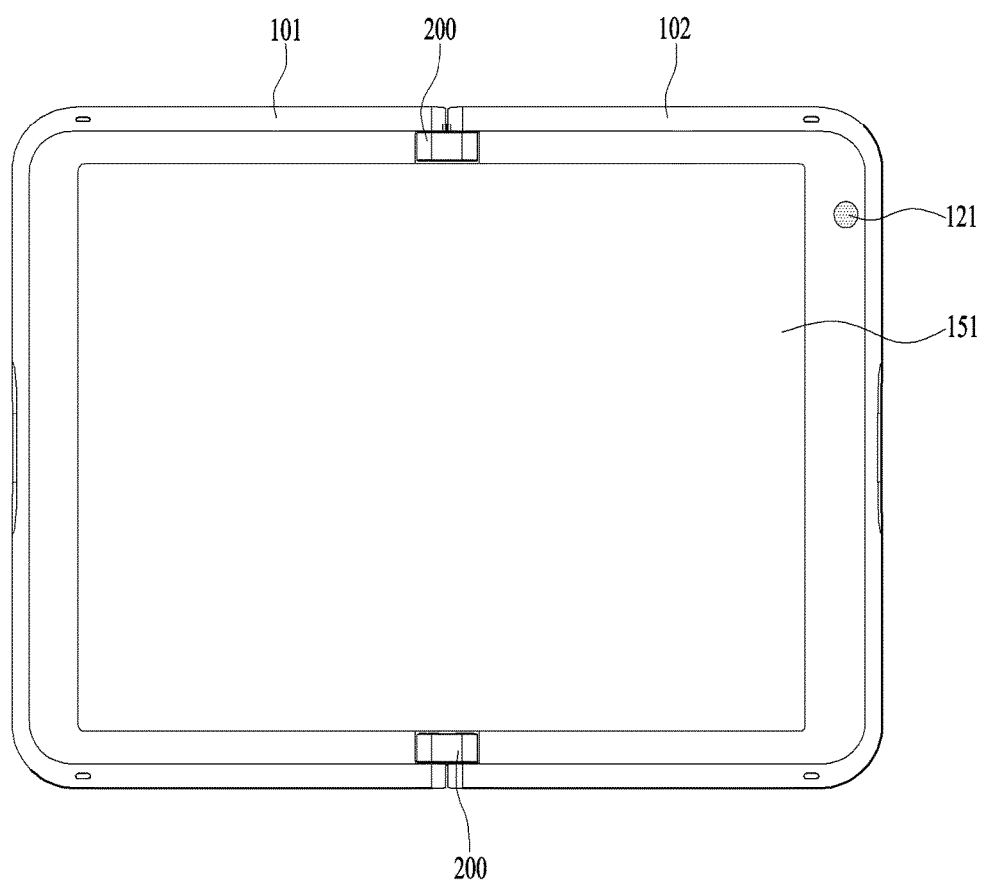
FIG. 2 is a front view of the mobile terminal in accordance with one embodiment.

FIG. 2 is a front view of the mobile terminal in accordance with one embodiment. FIG. 3 (a) illustrates a state where the mobile terminal is unfolded and FIG. 3 (b) illustrates a state where the mobile terminal is folded.

The mobile terminal in accordance with embodiments of the present disclosure may include two bodies to be characterized in a foldable structure like a book. To realize such a foldable structure, a first body 101 and a second body 102 may be connected by a hinge. A hinge rotatable on one axis has to be located in a different flat surface from each body and such a hinge has to be realized as a projected type from the body disadvantageously.

Accordingly, the illustrated embodiment suggests a double hinge module 200 having two shafts to connect the two bodies with each other. The double hinge module 200 includes a pair of shafts 225a and 225b; and rotary cams 220a and 220b which are rotatable on the pair of the shafts 225a and 225b. If a distance between the shafts 225a and 225b is too narrow or far, the shafts might be spaced apart or projected from the bodies 101 and 102 disadvantageously. Considering the thickness of the bodies 101 and 102, the two shafts 225a and 225b of the double hinge module 200 may be arranged.

The double hinge module 200 shown in FIG. 2 are not overlapped with the display unit 151 but arranged in at least one of the upper and lower bezel areas. The double hinge module 200 of the present disclosure is compact-sized enough to occupy a small space so that it may be arranged without being overlapped with the display unit 151.

Figure 4:
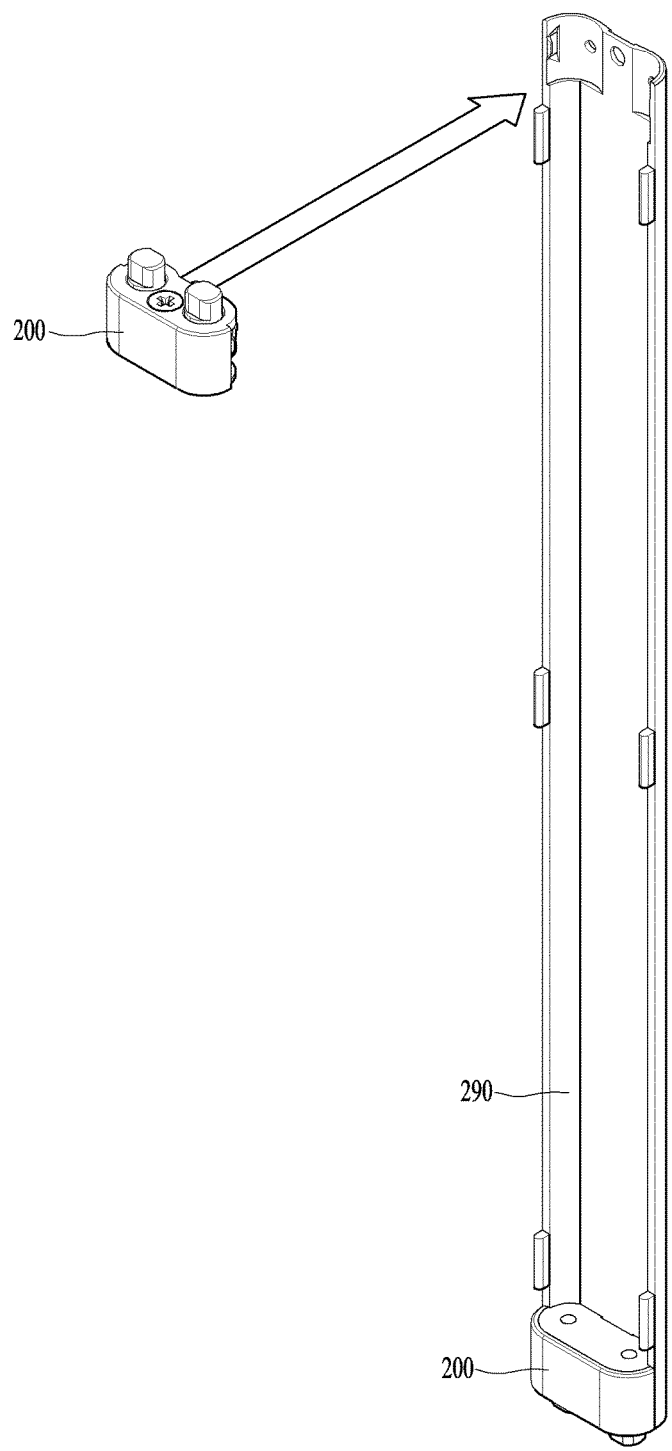
FIG. 4 is a perspective diagram illustrating a double hinge module and a folding unit in accordance with one embodiment.

FIG. 4 is a perspective diagram illustrating the double hinge module 200 and a folding unit in accordance with one embodiment. In case the double hinge modules 200 are provided in upper and lower portions of the display unit 151, respectively, as shown in FIG. 4, a rear surface of the display unit 151 has an empty space. In other words, a connect-portion is formed in the area between the first body 101 and the second body 102, which face each other, in a concave shape toward the rear surface of the display. When the first body 101 and the second body 102 are folded, while the surfaces in which the display unit 151 is provided as shown in FIG. 3 (b) are facing each other, the display unit 151 is accommodated by the connect-portion so that it can be gently bending, not folded completely.

As shown in FIG. 4, the double hinge module 200 may further include a bracket 290 formed in a concave shape corresponding to the connect-portion. The bracket 290 is configured to prevent the rear surface of the display unit 151 from being exposed outside between the first body 101 and the second body 101 (in a direction viewed from a lower side of FIG. 3 (b)), when one surface of the first body 101 faces one surface of the second body 102.

Figure 5:
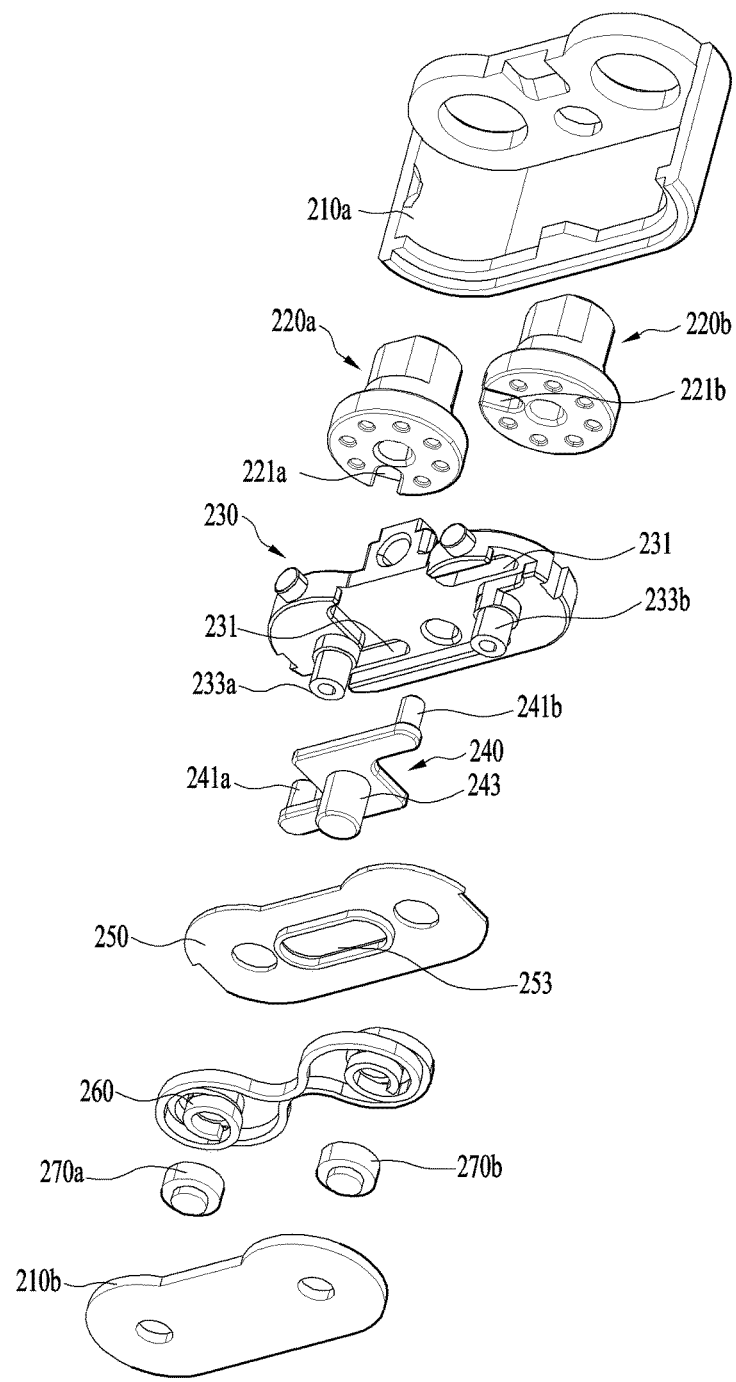
FIG. 5 is an exploded perspective diagram of the double hinge module in accordance with one embodiment.

FIG. 5 is an exploded perspective diagram of the double hinge module 200 in accordance with one embodiment. Referring to FIG. 5, the double hinge module 200 includes a hinge housing 210a and 210b; a pair of rotary cams 220a and 220b; a middle frame 230; a link 240; a guide plate 250; and an elastic stopper 260.

The pair of the rotary cams 220a and 220b are coupled to the first body 101 and the second body 102, respectively.

The rotary cams 220a and 220b are partially projected outside the hinge housing 210 and 210b defining the exterior design of the double hinge module. The projected portion is coupled to the case of the first and second bodies 101 and 102. When a folded state (the state shown in FIG. 3 (a)) is changed into a unfolded state (the state shown in FIG. 3 (b)), a first rotary cam 220a is moved together with the first body 101 and a second rotary cam 220b is moved together with the second body 102. At this time, the hinge housing 210a and 210b, the middle frame 230 and the guide plate 250 will not be rotated.

The vertical length of the hinge housing 210a and 210b is twice the horizontal length so that the first and second bodies 101 and 102 may not be separated or projected in the folded state and the unfolded state. If the horizontal length is twice or less the vertical length, the first body 101 might be separated from the second body 102 in the unfolded state and the connect-portion between the first body 101 and the second body 102 might be projected in the folded state. If the horizontal length is more than twice the vertical length, the first body 101 might be separated from the surface of the second body 102 in the folded sate, without stuck thereto.

The first rotary cam 220a is rotatable on the first shaft 225a and the second rotary cam 220b is rotatable on the second shaft 225b. The first rotary cam 220a and the second rotary cam 220b are rotatable in the reverse directions at the same time and the maximum rotation angle may be 90°. One side of each rotary cam 220a and 220b is coupled to the body and the other side has a coupling slot 221a and 221b. The coupling slots 221a and 221b are extended from the other side in a direction which gets farther from the shafts 225a and 225b and coupling projections 241a and 241b of the link 240 are inserted in the coupling slots 221a and 221 b. A first coupling slot 221a is located in opposite to a second coupling slot 221b with respect to a central line.

The link 240 is provided as the device configured to guide the rotation of the first and second rotary cams 220a and 220b in the reverse directions. One end of the link 240 is coupled to the first coupling slot 221a and the other end is coupled to the second coupling slot 221b of the second rotary cam 220b. Coupling projections 241a and 241b are formed in the ends to be inserted in the coupling slots 221a and 221b, respectively. The coupling projections 241a and 241b inserted in the coupling slots 221a and 221b may be movable along a longitudinal direction of the coupling slots 221a and 221b.

Figure 6:
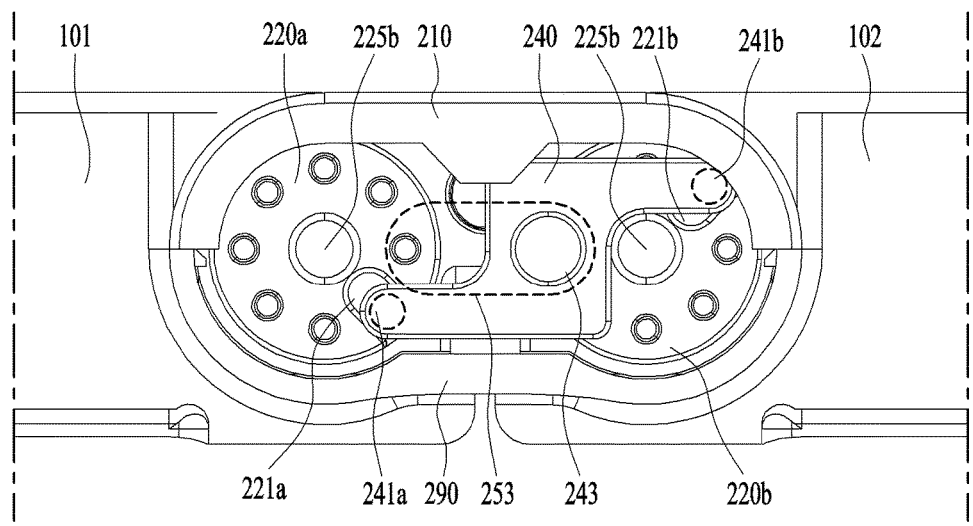
FIGS. 6 through 8 are diagrams to describe the drive of the double hinge module.
Figure 7:
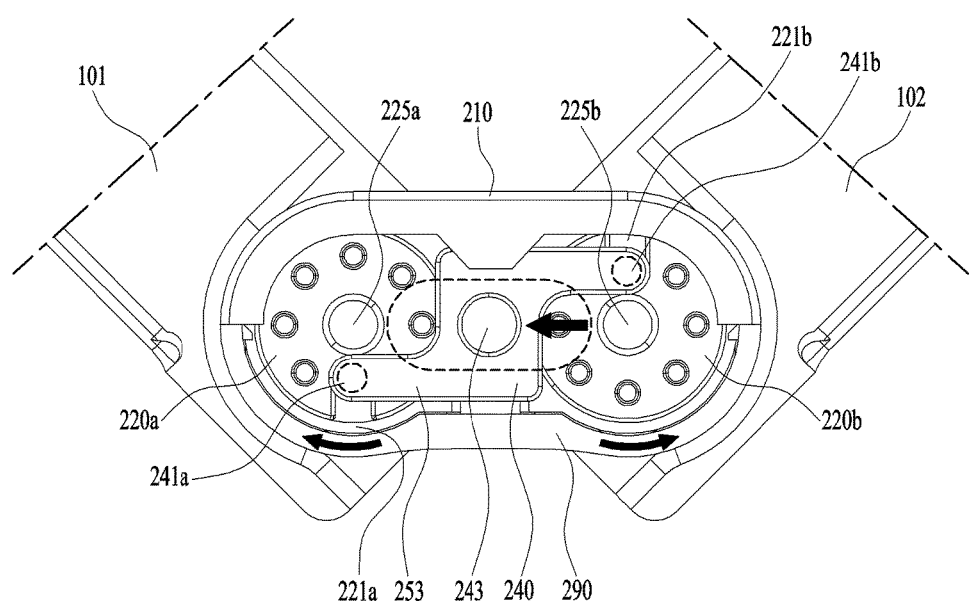
Figure 8:
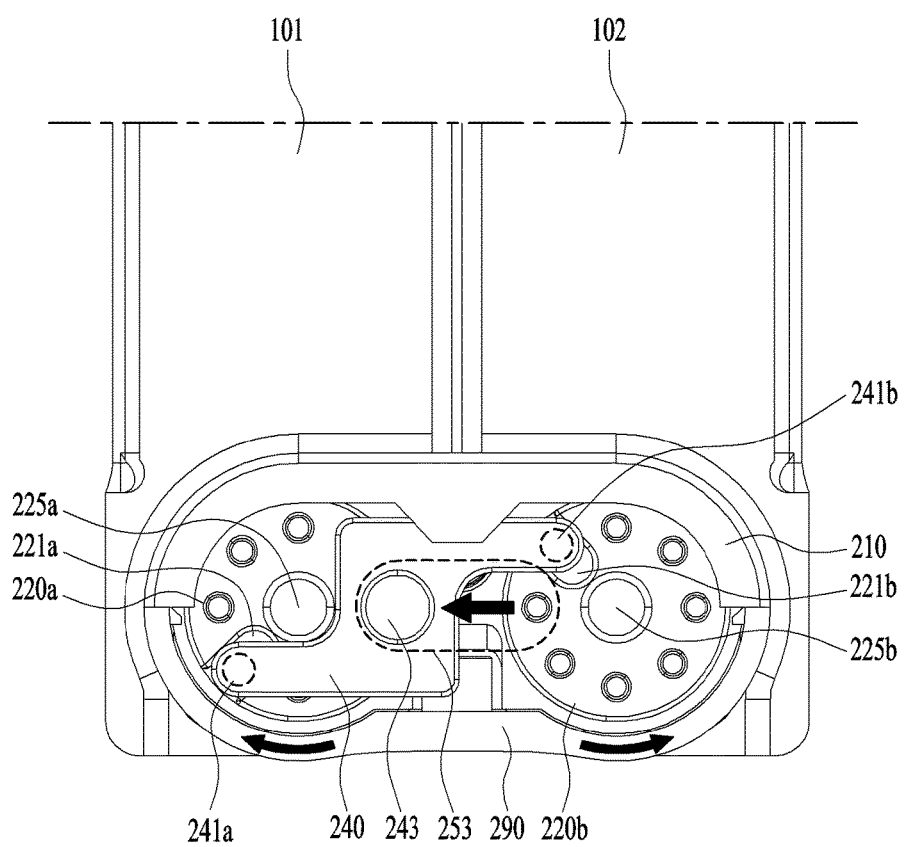

When the rotary cams 220a and 220b are rotating, the link 240 performs a linear movement to guide the first and second rotary cams 220a and 220b to move symmetrically. FIGS. 6 through 8 are diagrams to describe the drive of the double hinge module 200. As mentioned above, the pair of the rotary cams 220a and 220b are rotatable in the reverse directions to be changed into the folded state of FIG. 8 from the unfolded state of FIG. 6 via the state of FIG. 7.

The first coupling slot 221a and the second coupling slot 221b are located in the opposite with respect to the central line. When the first rotary cam 220a is rotating in a clockwise direction and the second rotary cam 220b is rotating in the counter-clockwise direction, the first coupling slot 221a and the second coupling slot 221b are moving from the right to the left. Accordingly, the link 240 is also moving linearly from the right to the left.

The first and second coupling slots 221a and 221b performs the rotational movement along the rotation of the rotary cams 220a and 220b, not the linear movement. The distance between the first and second coupling slots 221a and 221b is variable. The distance between the first coupling projection 241a coupled to the first coupling slot 221a and the second coupling projection 241b coupled to the second coupling slot 221b is uniform. If the distance between the first and second coupling slots 221a and 221b is not uniform, the rotational movement of the rotary cams 220a and 220b and the linear movement of the link 240 cannot be performed at the same time. The variable distance may be compensated in a preset range by using the coupling slots 221a and 221b extended farther from the shafts 225a and 225b.

In a state where the first body 101 and the second body 102 are unfolded or folded as shown in FIGS. 6 and 8, the first and second coupling projections 241a and 241b are located an outer portion with respect to the first and second coupling slots 221a and 221b (in the direction which gets farther from the shafts 225a and 225b). In a state where the first body 101 and the second body 102 are folded to form an angle of 90° (see FIG. 7), the first and second coupling projections 241a and 241b are located in an inner portion with respect to the first and second coupling slots 221a and 221b (in the direction which gets closer to the shafts 225a and 225b). While the first cam 210a and the second cam 210b are rotating 90°, respectively, the link 240 is linearly moving from the right to the left.

Figure 9:
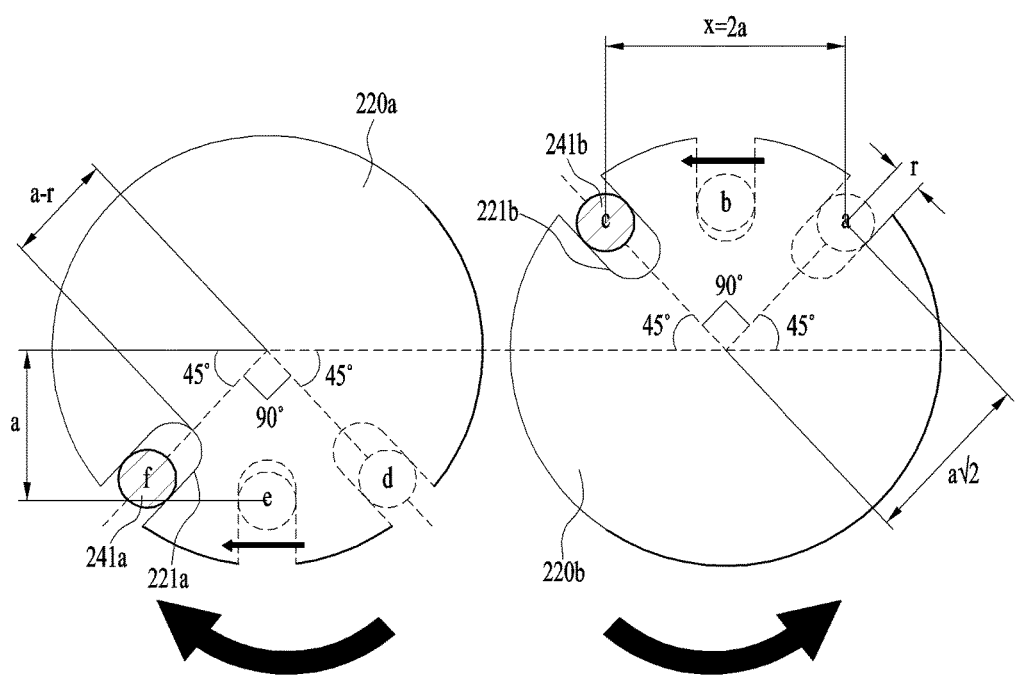
FIG. 9 is a diagram illustrating a location relation between a coupling slot and a coupling projection and the size of a coupling slot and a rotation cam.

FIG. 9 is a diagram illustrating a location relation between the coupling slots 221a and 221b and the coupling projections 241a and 241b and the size of the coupling slots 221a and 221b and the rotary cams 220a and 220b, when the double hinge module 200 is rotating. FIG. 9 is a drawing numerically illustrating the movement more precisely. In this instance, the first and second rotary cams 220a and 220b, the first and second coupling slots 221a and 221b and the first and second coupling slots 241a and 241b have the same size.

In the state where the first body 101 and the second body 102 form the angle of 90° (see FIG. 7), the first coupling projection 241a and the second coupling projection 241b are located in the first coupling slot 221a and the second coupling slot 221b, respectively. At this time, a distance from the shafts 225a and 225b to the coupling projections 241a and 241b is referenced to as "a". The coupling slots 221a and 221b are as close to the shafts 225a and 225b as a radius of the coupling projections 241a and 241b so that ends of the coupling slots 221a and 221b may be equal to or close to a-r from the shafts 225a and 225b.

In the state where the first body 101 and the second body 102 are folded or unfolded (see FIG. 6 or FIG. 8), the distance from the shafts 225a and 225b of the coupling projections 241 and 241b is the longest. A distance from the central line to the second coupling projection 241b at a point of 'b' is equal to a distance at a point of 'a'. The distance from the second shaft 225b to the second coupling projection 241b is a√2. As the first coupling projection 241a and the second coupling projection 241b are located outside the first coupling slot 221a and the second coupling slot 221b, diameters of the rotary cams 220a and 220b have to be larger than a√2.

When the mobile terminal is changed from the folded state into the unfolded state, the moving distance of the link 240 is 2a, corresponding to the moving distance of the second coupling projection 241b.

FIG. 10 is a diagram illustrating a stopping projection 243 and an elastic stopper 260 along movement of the link 240 when the double hinge module 200 is rotating. A stopper has to be provided to restrict the rotation of the rotary cams 220a and 220b to fix the folded state and the unfolded state of the first and second bodies 101 and 102. The double hinge module 200 in accordance with the present disclosure is capable of keeping the unfolded state and the folded state by using the elastic stopper 260 and the stopping projection 243 projected from only the link 240 unless the user applies a force to the mobile terminal to fold or unfold the first and second bodies 101 and 102.

The stopping projection 243 is fixed to stop the movement of the link 240 in a state where the mobile terminal is unfolded and folded and restrict the rotation of the rotary cams 220a and 220b. The elastic stopper 260 shown in FIG. 10 is projected from the portion where the stopping projection 243 is located in the moving passage of the stopping projection 243 in a state where the first body 101 and the second body 102 form the angle of 90°. Accordingly, the stopping projection 243 has to be moved by the force stronger than the elastic force of the elastic stopper 260 so as to change the folded state into the unfolded state. As shown in FIG. 5, the elastic stopper 260 may be a plate spring having a preset curve and coupled to the shaft or housing projected from the middle frame 230. Fixing cams 270a and 270b may be provided to fix the elastic stopper 260 to the shaft.

The stopping projection 243 may be movable along a guide slot 253 formed in the guide plate 250 fixed to the housing. The stopping projection 243 may help the linear movement of the link 240 while restricting the rotation of the rotary cams 220a and 220b.

The middle frame 230 shown in FIG. 5 may be provided between the rotary cams 220a and 220b and the link 240. The rotary cams 220a and 220b are coupled to the shaft projected from the middle frame 230 to rotate. In other words, the shaft of the middle frame 230 includes the shafts 225a and 225b of the rotary cams 220a and 220b. The middle frame 230 includes penetrating slots 231a and 231b which are extended in parallel with the central line. The coupling projections 241a and 241b may be coupled to the coupling slots 221a and 221b through the penetrating projections.

According to the duel hinge module described above, the mobile terminal configured of the first body 101 and the second body 102 may be folded and unfolded naturally like a book. The double hinge module is compact-sized enough to prevent the increase of the mobile terminal in the size and thickness.

Any specific parts of the mobile terminal may not be projected in the folded state and the first body 101 and second body 102 will not be separated from each other. Moreover, the display unit 151 may be bending with forming the curve in the folded state of the mobile terminal.

Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A double hinge module comprising:
a first rotary cam which is rotatable on a first shaft;

a first coupling slot extended from one end of the first rotary cam in a direction which gets farther from the first shaft;

a second rotary cam which is rotatable on a second shaft parallel with the first shaft in a reverse direction of the first rotary cam;

a second coupling slot extended from one end of the second rotary cam which gets farther from the second shaft; and a link having one end coupled to the first coupling slot and an other end coupled to the second coupling slot, wherein when the first rotary cam and the second rotary cam are rotating, the link is linearly movable in parallel with a central line connecting the first shaft and the second shaft with each other.

2. The double hinge module of claim 1, wherein the first coupling slot is located in a predetermined portion of the central line and the second coupling slot is located in an other opposite portion of the central line.

3. The double hinge module of claim 1, further comprising:

a middle frame disposed between the link and the first and second rotary cams and having the first and second shafts coupled thereto;

a first penetrating slot and a second penetrating slot which are formed the middle frame, in parallel with the central line;

a first coupling projection projected from the other end of the link and coupled to the second coupling slot via the second penetrating slot; and a second coupling projection projected from a second end of the link and coupled to the second coupling slot via the second penetrating slot, wherein when the first and second rotary cams are rotating, the first coupling projection and the second coupling projection are moving along the first penetrating slot and the second penetrating slot, respectively.

4. The double hinge module of claim 3, further comprising:

a hinge housing defining an exterior design of the double hinge module and having the middle frame coupled thereto.

5. The double hinge module of claim 1, further comprising:

a stopping projection projected from the link; and an elastic stopper projected on a linear movement passage of the stopping projection, wherein the first rotary cam and the second rotary cam rotate when a preset force or more is applied thereto.

6. The double hinge module of claim 5, wherein the elastic stopper is a plate spring coupled to at least one of first and second shafts.

7. The double hinge module of claim 5, further comprising:

a guide plate comprising a guide slot extended in parallel with the central line, wherein the stopping projection is inserted in the guide slot and movable in a direction in which the guide slot is extended.

8. The double hinge module of claim 3, wherein a radius of each of the first and second coupling projections is 'r', wherein a distance from ends of the first and second coupling slots and the first and second shafts is 'a-r', and wherein a radius of each of the first and second rotary cams is larger than $a\sqrt{2}$.

9. The double hinge module of claim 8, wherein the maximum rotation angle of the first and second rotary is 90°, and wherein the link is linearly moved as far as 2a.

10. A mobile terminal comprising:

a first body;

a second body;

a display unit arranged in one surface of the first body and one surface of the second body and comprising a flexible material;

a double hinge module coupled between the first body and the second body and configured to vary angles of the first body and the second body; and a connect portion provided in neighboring ends of the first body and the second body which are covered with the display unit and concavely formed in one surface of the first body and one surface of the second body, wherein the display unit forms a flat surface in a state where the first body and the second body are unfolded with lateral surfaces facing each other, and a predetermined area of the display unit is accommodated by the connect portion in a state where the first body and the second body are folded with the surfaces facing each other, wherein the double hinge module comprises:

a first rotary cam which is rotatable on a first shaft;

a first coupling slot extended from one end of the first rotary cam in a direction which gets farther from the first shaft;

a second rotary cam which is rotatable on a second shaft parallel with the first shaft in a reverse direction of the first rotary cam;

a second coupling slot extended from one end of the second rotary cam which gets farther from the second shaft; and a link having one end coupled to the first coupling slot and an other end coupled to the second coupling slot, and wherein when the first rotary cam and the second rotary cam are rotating, the link is linearly movable in parallel with a central line connecting the first shaft and the second shaft with each other.

11. The mobile terminal of claim 10, wherein each of the first and second bodies comprises a bezel area to which the display unit is not coupled, and the double hinge module is provided in the bezel areas.

12. The mobile terminal of claim 10, wherein a pair of double hinge modules are provided in both ends of the connect portion, respectively.

13. The mobile terminal of claim 10, further comprising:

a bracket formed in a corresponding shape to the shape of the connect portion, wherein the bracket is exposed outside in the folded state.

14. The mobile terminal of claim 10, wherein when one lateral surface of the first body faces one lateral surface of the second body, the first body and the second body are arranged in parallel with the central line, and wherein when one surface of the first body faces one surface of the second body, the first body and the second body are vertically arranged with respect to the central line.

15. The mobile terminal of claim 10, further comprising:

a middle frame disposed between the link and the first and second rotary cams and having the first and second shafts coupled thereto;

a first penetrating slot and a second penetrating slot which are formed the middle frame, in parallel with the central line; and a first coupling projection projected from one the other end of the link and coupled to the second coupling slot via the second penetrating slot, wherein when the first and second rotary cams are rotating, the first coupling projection and the second coupling projection are moving along the first penetrating slot and the second penetrating slot.

16. The mobile terminal of claim 15, wherein a radius of each of the first and second coupling projections is 'r', wherein a distance from ends of the first and second coupling slots and the first and second shafts is 'a-r', and wherein a radius of each of the first and second rotary cams is larger than $a\sqrt{2}$.

17. The mobile terminal of claim 16, wherein the maximum rotation angle of the first and second rotary is 90°, and the link is linearly moved as far as 2a.

18. The mobile terminal of claim 10, further comprising:

a stopping projection projected from the link; and an elastic stopper projected on a linear movement passage of the stopping projection, wherein the first rotary cam and the second rotary cam rotate when a preset force or more is applied thereto.

19. The mobile terminal of claim 18, further comprising:

a guide plate comprising a guide slot extended in parallel with the central line, wherein the stopping projection is inserted in the guide slot and movable in a direction in which the guide slot is extended.

* * * * *